US009129592B2

(12) United States Patent
Pahuja et al.

(10) Patent No.: US 9,129,592 B2
(45) Date of Patent: Sep. 8, 2015

(54) SIGNAL ARTIFACT DETECTION AND ELIMINATION FOR AUDIO OUTPUT

(71) Applicant: iBiquity Digital Corporation, Columbia, MD (US)

(72) Inventors: Ashwini Pahuja, Albertson, NY (US); Weifeng Mu, Freehold, NJ (US)

(73) Assignee: iBiquity Digital Corporation, Columbia, MD (US)

( * ) Notice: Subject to any disclaimer, the term of this patent is extended or adjusted under 35 U.S.C. 154(b) by 279 days.

(21) Appl. No.: 13/844,096

(22) Filed: Mar. 15, 2013

(65) Prior Publication Data

US 2014/0270252 A1 Sep. 18, 2014

(51) Int. Cl.

*H03G 11/00* (2006.01)
*G10L 19/005* (2013.01)
*G10L 21/0208* (2013.01)

(52) U.S. Cl.

CPC ........... *G10L 19/005* (2013.01); *G10L 21/0208* (2013.01)

(58) Field of Classification Search

CPC ....... H03G 11/00; H04N 40/18; H04N 20/30; H04B 1/1684; H04B 1/109; H04H 20/00
USPC ............ 381/94.5, 119, 17; 375/350; 455/132, 455/130
See application file for complete search history.

(56) References Cited

U.S. PATENT DOCUMENTS

| | | | | |
|---|---|---|---|---|
| 2001/0050926 | A1 * | 12/2001 | Kumar | 370/529 |
| 2004/0008285 | A1 * | 1/2004 | Takahashi et al. | 348/723 |
| 2005/0020220 | A1 * | 1/2005 | Gamou | 455/132 |

* cited by examiner

*Primary Examiner* — Melur Ramakrishnaiah
(74) *Attorney, Agent, or Firm* — Terrile, Cannatti, Chambers & Holland, LLP; Michael Rocco Cannatti

(57) ABSTRACT

A method and apparatus are provided for processing a received digital radio broadcast signal to efficiently remove signal interference artifacts from digital and/or analog signals by using signal quality information extracted from audio samples in one or more buffered audio frames to detect audio frames containing clipped noise artifacts and weaker noise artifacts and to selectively apply anti-interference processing to remove the signal interference artifacts.

20 Claims, 7 Drawing Sheets

SIGNAL ARTIFACT DETECTION AND ELIMINATION FOR AUDIO OUTPUT

BACKGROUND OF THE INVENTION

1. Field of the Invention

The present invention is directed in general to digital radio broadcast receivers and methods for operating same. In one aspect, the present invention relates to methods and apparatus for receiving and processing a digital or analog audio signal.

2. Description of the Related Art

Digital radio broadcasting technology delivers digital audio and data services to mobile, portable, and fixed receivers using existing radio bands. One type of digital radio broadcasting, referred to as in-band on-channel (IBOC) digital radio broadcasting, transmits digital radio and analog radio broadcast signals simultaneously on the same frequency using digitally modulated subcarriers or sidebands to multiplex digital information on an AM or FM analog modulated carrier signal. HD Radio™ technology, developed by iBiquity Digital Corporation, is one example of an IBOC implementation for digital radio broadcasting and reception. With this arrangement, the audio signal can be redundantly transmitted on the analog modulated carrier and the digitally modulated subcarriers by transmitting the analog audio AM or FM backup audio signal (which is delayed by the diversity delay) so that the analog AM or FM backup audio signal can be fed to the audio output when the digital audio signal is absent, unavailable, or degraded. In these situations, the analog audio signal is gradually blended into the output audio signal by attenuating the digital signal such that the audio is fully blended to analog as the digital signal become unavailable. Similar blending of the digital signal into the output audio signal occurs as the digital signal becomes available by attenuating the analog signal such that the audio is fully blended to digital as the digital signal becomes available. Notwithstanding the smoothness of the blending function, blend transitions between analog and digital signals can degrade the listening experience when the audio differences between the analog and digital signals are significant. For example, at the edge of a station coverage where the signal is changing around the minimum required level, squawk-like interference can occur when the signal is briefly under the required level, in which case the decoder fails to generate real audio, and instead sends out meaningless data. In most cases, this trash data tends to fluctuate to the maximum amplitude, thereby creating a sudden, short-period and uncomfortable squawk-like pop noise. Accordingly, a need exists for improved method and apparatus for processing received audio signals to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
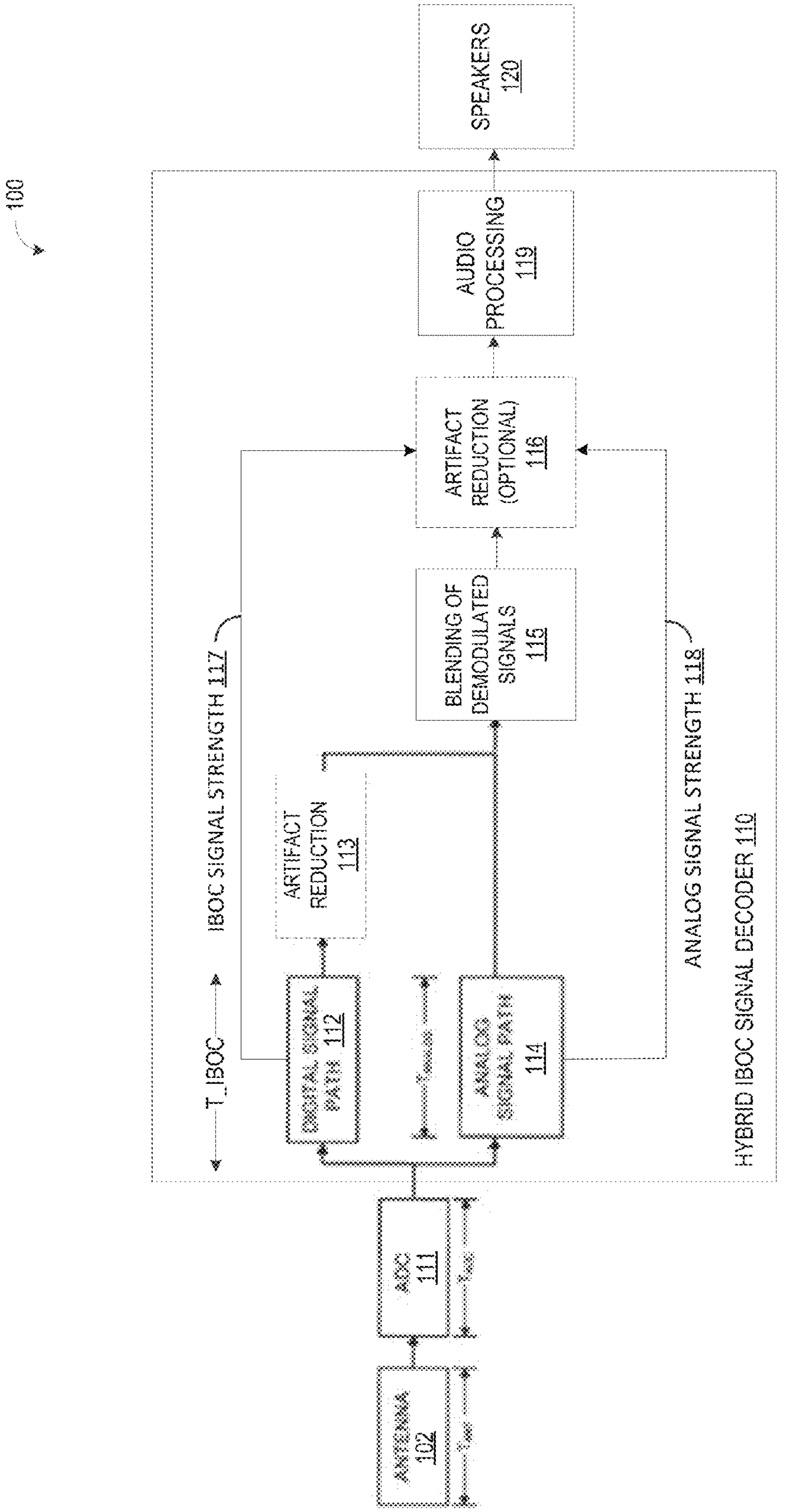
FIG. 1 illustrates a simplified timing block diagram of an exemplary digital broadcast receiver for processing digital and/or analog audio signals to remove signal interference artifacts in accordance with selected embodiments.

A digital radio broadcast receiver apparatus and associated methods for operating same are described for efficiently removing signal interference artifacts, such as decoded audio squawks, from digital and/or analog signals by using signal quality information extracted from audio samples in one or more buffered audio frames to detect audio frames containing clipped noise artifacts and weaker noise artifacts and to selectively apply anti-interference processing to remove the signal interference artifacts. In selected embodiments, signal quality values (e.g., signal-to-noise measures computed at each audio frame) are extracted over time from the received signal by the receiver's modem front end and stored in a buffer for use by the receiver's back end processor to control processing of digital and analog signals. Due to delays associated with the back processing of received signals, the stored signal quality values effectively provide the back end processor with advance or a priori knowledge of digital signal noise artifacts. With this advance knowledge, the digital radio receiver may detect "bad" audio frames having noise artifacts by determining if a first threshold number of audio samples meets or exceeds a first amplitude threshold value using a fine-detection process which is applied to each data frame of audio samples by counting if there is substantial number of data samples within each data frame that exceeds a pre-determined signal level to determine whether the data frame is corrupted with interference or not. Once a bad frame is detected, the audio samples in the current "bad" frame may be processed to mitigate the interference on any flagged data frame. To avoid missing corruption events that straddle different data frames, the adjacent frames right before and after the flagged frame may also be flagged for further mitigation processing. Thus, to make multiple data frames available for analysis and processing at any given time, the buffer memory is allocated to buffer an entire audio frame when new data frame pumps in. In addition, a coarse-detection process may be applied to detect minor interferences that typically appear shortly after the significant clipping interference events. In this case, a coarse-detection timer is initialized whenever a major clipping interference event has been detected with the fine-detection process. A coarse-detection process may be applied to detect a second threshold number of audio samples meeting or exceeding a second, smaller amplitude threshold value. Whenever the coarse-detection timer is running and fine-detection process returns negative results, a coarse-detection is triggered to detect the minor interference. Using the results of the fine-detection and coarse-detection process, selected anti-interference processing is applied to the current audio frame stored in (buffered) memory, such as by applying a mute or smoothing function to the audio frame samples, depending on the duration of the detected interference artifact. For example, upon detecting a minor interference event while the coarse-detection timer is running, a coarse-artifact mitigation process is applied to remove the minor interferences. Again the processed data need to pass the same low-pass filter and then be sent out to the output buffer. In this way, digital signals can be processed to remove the interference artifacts and thereby reduce unpleasant disruptions in the listening experience.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Some portions of the detailed descriptions provided herein are presented in terms of algorithms and instructions that operate on data that is stored in a computer memory. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Referring now to FIG. 1, there is shown a simplified timing block diagram of an exemplary digital radio broadcast receiver 100 for processing digital and/or analog audio signals to remove signal interference artifacts contained in a received hybrid radio broadcast signal in accordance with selected embodiments. Upon reception at the antenna 102, the received hybrid signal is processed for an amount of time $T_{ANT}$ which is typically a constant amount of time that will be implementation dependent. The received hybrid signal is then digitized, demodulated, and decoded by the IBOC signal decoder 110, starting with an analog-to-digital converter (ADC) 111 which processes the signal for an amount of time $T_{ADC}$ which is typically an implementation-dependent constant amount of time to produce digital samples which are down converted to produce lower sample rate output digital signals.

In the IBOC signal decoder 110, the digitized hybrid signal is split into a digital signal path 112 and an analog signal path 114 for demodulation and decoding. In the analog path 114, the received analog portion of the hybrid signal is processed for an amount of time $T_{ANALOG}$ to produce audio samples representative of the analog portion of the received hybrid signal, where $T_{ANALOG}$ is typically a constant amount of time that is implementation dependent. With processing in the analog path 114, an analog signal strength measure 118 may be generated. In the digital signal path 112, the hybrid signal decoder 110 acquires and demodulates the received digital IBOC signal for an amount of time $T_{DIGITAL}$, where $T_{DIGITAL}$ is a variable amount of time that will depend on the acquisition time of the digital signal and the demodulation times of the digital signal path 112. The acquisition time can vary depending on the strength of the digital signal due to radio propagation interference such as fading and multipath. The digital signal path 112 applies Layer 1 processing to demodulate the received digital IBOC signal using a fairly deterministic process that provides very little or no buffering of data based on a particular implementation. In addition, the processing in the digital path 112 may generate an IBOC signal strength measure 117. The digital signal path 112 then feeds the resulting data to one or more upper layer modules which decode the demodulated digital signal to maximize audio quality. In selected embodiments, the upper layer decoding process involves buffering of the received signal based on over-the-air conditions. In selected embodiments, the upper layer module(s) may implement a deterministic process for each IBOC service mode (MP1-MP3, MP5, MP6, MP11, MA1 and MA3). As depicted, the upper layer decoding process includes an artifact reduction module 113 which processes look ahead metrics obtained from the demodulated digital signal in the digital signal path 112 to remove signal interference artifacts from the digital signal.

At the audio transition or blending module 115, the samples from the digital signal (provided via artifact reduction module 113) are aligned and blended with the samples from the analog signal (provided directly from the analog signal path 114). To the extent that signal artifacts are removed from the digital signal by the artifact reduction module 113, the blend decision module 115 can avoid unnecessary blending from digital to analog since potential signaling errors associated with the signal artifacts are removed. Alternatively, the signal processing to remove signal interference artifacts can be provided post-blending by including an optional artifact reduction module 116. As shown, the optional artifact reduction module 116 processes the combined digitized audio signal output from the blend module 115 based on the generated IBOC and analog signal strength measures 117, 118. Finally, the combined digitized audio signal is processed at the audio processing module 119 for output to the speakers 120.

Figure 2:
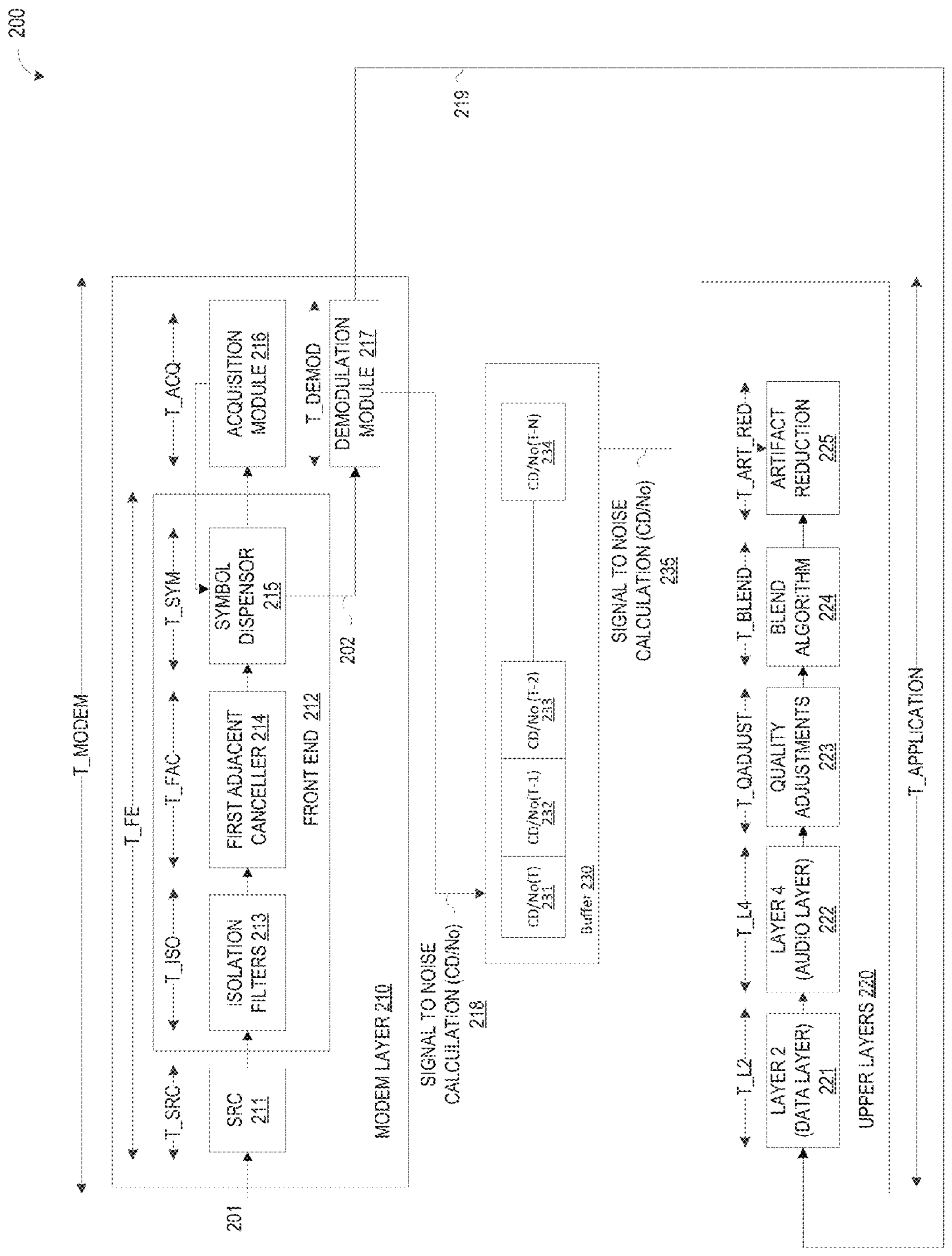
FIG. 2 illustrates a simplified timing block diagram of an exemplary digital broadcast receiver which calculates signal quality information for use in reducing signal interference artifacts during processing of digital and analog audio FM signals in accordance with selected embodiments.

Turning now to FIG. 2, there is shown a simplified timing block diagram of an exemplary digital radio broadcast receiver 200 having a modem layer module 210 and application layer module 220 for calculating signal quality information for use in reducing signal interference artifacts during processing of digital and analog audio FM signals. The functions illustrated in FIG. 2 can be performed in whole or in part in a baseband processor or similar processing system that includes one or more processing units configured (e.g., programmed with software and/or firmware) to perform the specified functionality and that is suitably coupled to one or more memory storage devices (e.g., RAM, Flash ROM, ROM). For example, any desired semiconductor fabrication method may be used to form one or more integrated circuits with a processing system having one or more processors and memory arranged to provide the digital broadcast receiver functional blocks for aligning and blending digital and analog audio signals.

As illustrated, the modem layer 210 receives signal samples 201 containing the analog and digital portions of the received hybrid signal which may optionally be processed by a Sample Rate Conversion (SRC) module 211 for a processing time $T_{SRC}$. Depending on the implementation, the SRC module 211 may or may not be present, but when included, the processing time $T_{SRC}$ is a constant time for that particular implementation. The digital signal samples are then processed by a front-end module 212 which filters and dispenses the digital symbols to generate a baseband signal 202. In selected example embodiments, the front-end module 212 may implement an FM front-end module which includes an isolation filter 213, a first adjacent canceler 214, and a symbol dispenser 215, depending on the implementation. In other embodiments, the front-end module 212 may implement an FM front-end module which includes only the symbol dispenser 215, but not the isolation filter 213 or first adjacent canceler 214. In the FM front-end module 212, the digital signal samples are processed by the isolation filter 213 during processing time $T_{ISO}$ to filter and isolate the digital upper and lower sidebands. Next, the signal may be passed through an optional first adjacent canceler 214 during a processing time $T_{FAC}$ in order to attenuate signals from adjacent FM signal bands that might interfere with the signal of interest. Finally, the attenuated FM signal (or AM signal) enters the symbol dispenser 215 which accumulates samples (e.g., with a RAM buffer) during a processing time $T_{SYM}$. From the symbol dispenser 215, baseband signals 202 are generated. Depending on the implementation, the isolation filter 213, the first adjacent canceler 214, and/or the symbol dispenser 215 may or may not be present, but when included, the corresponding processing time is constant for that particular implementation.

With FM receivers, an acquisition module 216 processes the digital samples from the front end module 212 during processing time $T_{ACQ}$ to acquire or recover OFDM symbol timing offset or error and carrier frequency offset or error from received OFDM symbols. When the acquisition module 216 indicates that it has acquired the digital signal, it adjusts the location of a sample pointer in the symbol dispenser 215 based on the acquisition time with an acquisition symbol offset feedback signal. The symbol dispenser 215 then calls the demodulation module 217.

The demodulation module 217 processes the digital samples 202 from the front end module 212 during a processing time $T_{DEMOD}$ to demodulate the signal and present the demodulated data 219 for decoding to the application layer 220 for upper layer processing, where the total application layer processing time $T_{Application}=T_{L2}+T_{L4}+T_{QADJUST}\ T_{ART\_RED}$. Depending on whether AM or FM demodulation is performed, the demodulation module 217 performs deinterleaving, code combining. FEC decoding, and error flagging of the received compressed audio data. In addition, the demodulation module 217 periodically determines and outputs a signal quality measure 218. In selected embodiments, the signal quality measure 218 is computed as signal-to-noise ratio values (CD/No) over time that are stored in a memory or storage buffer 230 for use as look ahead metrics 231-234 in guiding the removal of signal interference artifacts.

As seen from the foregoing, the total processing time at the modem layer 210 is $T_{MODEM}=T_{FE}+T_{DEMOD}$, where $T_{FE}=T_{SRC}+T_{ISO}+T_{FAC}+T_{SYM}$. Since the processing time for the front end module $T_{FE}$ is constant, there is a negligibly small difference between the time a signal sample is received at the antenna and the time that signal sample is presented to the demodulation module 217.

In the application layer(s) 220, the audio and data signals from the demodulated baseband signal 219 are demultiplexed and audio transport decoding is performed. In particular, the demodulated baseband signal 219 is passed to the L2 data layer module 221 which performs Layer 2 data layer decoding during the data layer processing time $T_{L2}$. The time spent in L2 module 221 will be constant in terms of audio frames and will be dependent on the service mode and band. The L2-decoded signal is then passed to the L4 audio decoding layer 222 which performs audio transport and decoding during the audio layer processing time $T_{L4}$. The time spent in L4 audio decoding module 222 will be constant in terms of audio frames and will be dependent on the service mode and band.

The L4-decoded signal is then passed to the quality adjustments module 223 which implements a quality adjustment algorithm during processing time $T_{QADJUST}$ for purposes of empowering the blend algorithm to lower the signal quality if the previously calculated signal quality measures indicate that the signal will be degrading. The time spent in quality adjustment module 223 will be constant in terms of audio frames and will be dependent on the service mode and band. The quality adjustment algorithm may use previously-stored signal quality measures 231-234 retrieved 235 from the memory/storage buffer 230 as look ahead metrics when deciding whether to adjust the audio quality. For example, if the previously-stored signal quality measures 231-234 indicate that the upcoming audio samples are degraded or below a quality threshold measure, then the quality adjustment module 223 may adjust the audio quality by a fixed or variable amount based on signal metric. This is possible because the receiver system is deterministic in nature, so there is a defined constant time delay (in terms for audio frames) between the time when a sample reaches the demodulation module 217 and the time when the same sample is presented to the quality adjustments module 223. As a result, the calculated signal quality measure (e.g., CD/No) for a sample that is stored in the memory/storage buffer 230 during signal acquisition may be used to provide the quality adjustments module 223 with advanced or a priori knowledge of when the digital signal quality goes bad. By computing and storing the system delay for a given mode (e.g., FM—MP1-MP3, MP5, MP6, MP11 and AM—MA1, MA3), the signal quality measure CD/No value(s) 231-234 stored in the memory/storage buffer 230 may be used by the quality adjustments module 223 after the time delay required for the sample to reach the quality adjustments module 223. This is possible because the processing time delay ($T_{L2}+T_{L4}$) between the demodulation module 217 and quality adjustment module 223 means that the quality adjustment module 223 is processing older samples (e.g.

CD/No(T−N)), but has access to "future" samples (e.g., CD/No(T), CD/No(T−1), CD/No(T−2), etc.) from the memory/storage buffer 230.

Subject to any L4 audio quality adjustments by the quality adjustments module 223, the blend algorithm module 224 processes the received signal during processing time $T_{BLEND}$ for purposes of deciding whether to stay in a digital or analog mode or to start digitally combining the analog audio frames with the realigned digital audio frames. The time spent in blend algorithm module 224 will be constant in terms of audio frames and will be dependent on the service mode and band. The blend algorithm module 224 decides whether to blend to digital or analog in response to a transition control signal from the quality adjustments module 223 for controlling the audio frame combination in terms of the relative amounts of the analog and digital portions of the signal that are used to form the output.

At the artifact reduction module 225, look ahead metrics 235 extracted from the digital signal are processed to efficiently remove signal interference artifacts from the digital signal by detecting audio frames containing clipped noise artifacts and weaker noise artifacts and selectively applying anti-interference processing to remove the signal interference artifacts. The artifact reduction module 225 processes the look ahead metrics 235 during processing time $T_{ART\_RED}$ to remove signal interference artifacts. The time $T_{ART\_RED}$ spent in artifact reduction module 225 will be constant in terms of audio frames and will be dependent on the service mode and band. Due to delays associated with the back processing of received signals, the stored look ahead metric values 235 effectively provide the artifact reduction module 225 with advance or a priori knowledge of digital signal noise artifacts. With this advance knowledge, the digital radio receiver may detect "bad" audio frames having noise artifacts by determining if a first threshold number of audio samples meets or exceeds a first amplitude threshold value using a fine-detection process. Once a bad frame is detected, the audio samples in the current "bad" frame may also be processed with a coarse-detection process to detect a second threshold number of audio samples meeting or exceeding a second amplitude threshold value. Using the results of the fine-detection and coarse-detection process, selected anti-interference processing is applied to the current audio frame stored in buffered memory, such as by applying a mute or smoothing function to the audio frame samples, depending on the duration of the detected interference artifact.

As disclosed herein, any desired evaluation algorithm may be used in the fine-detection and coarse-detection processes to evaluate the digital signal to determine if there are signal interference artifacts in the digital audio samples. For example, a preset signal threshold value (e.g., maxLvl) may define a minimum digital signal amplitude measure that must be met on a specified minimum number of times in a frame or sample region to allow the region under detection processing to be declared a "bad" frame or sample region. In addition or in the alternative, a threshold count may establish a trigger for detecting a "bad" frame or sample region having samples whose amplitude is greater than the preset signal threshold value (e.g., maxLvl). In addition or in the alternative, a "running average" or "majority voting" quantitative decision may be applied in relation to a minimum signal threshold value for all digital signal quality measures stored in the buffer 230 to detect a "bad" frame.

The ability to use previously-computed signal quality measures exists because the receiver system is deterministic in nature, so there is a defined constant time delay (in terms of audio frames) between the time when a sample reaches the demodulation module 217 and the time when the artifact detection and processing is performed at the artifact reduction module 225. As a result, the calculated signal quality measure CD/No value for a sample that is stored in the memory/storage buffer 230 during signal acquisition may be used to provide the artifact reduction module 225 with advanced or a priori knowledge of signal interference events in the digital signal quality. By computing and storing the system delay for a given mode (e.g., FM—MP1-MP3, MP5, MP6, MP11 and AM—MA1, MA3), the signal quality measure CD/No value(s) 231-234 stored in the memory/storage buffer 230 may be used by the blend artifact reduction module 225 after the time delay required for the sample to reach the artifact reduction module 225. This is possible because the processing time delay ($T_{L2}$+$T_{L4}$+$T_{QADJUST}$+$T_{BLEND}$) between the demodulation module 217 and artifact reduction module 225 means that the artifact reduction module 225 is processing older samples (e.g., CD/No(T−N)), but has access to "future" samples (e.g., CD/No(T), CD/No(T−1). CD/No(T−2), etc.) from the memory/storage buffer 230. In this way, the artifact reduction module 225 may remove signal interference artifacts from the digital signal, and thereby prevent the receiver from blending to a low bandwidth audio signal (e.g., analog audio signal) from a high bandwidth audio signal (e.g., digital IBOC signal).

Figure 3:
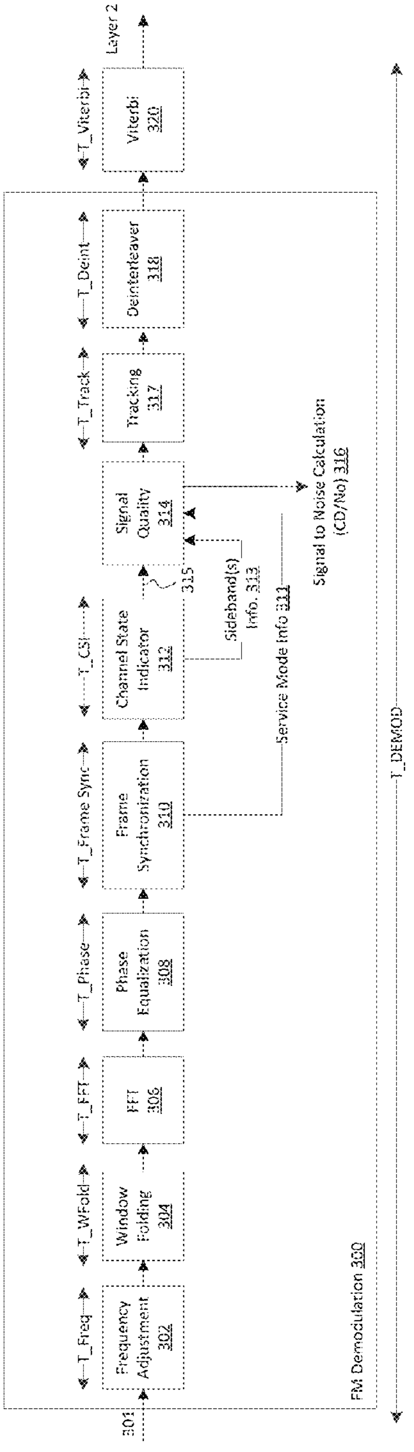
FIG. 3 illustrates a simplified timing block diagram of an exemplary FM demodulation module for calculating predetermined signal quality information for use in removing signal interference artifacts from audio FM signals in accordance with selected embodiments.

An exemplary FM demodulation module 300 is illustrated in FIG. 3 which shows a simplified timing block diagram of the FM demodulation module components for calculating predetermined signal quality information for use in removing signal interference artifacts from audio FM signals in accordance with selected embodiments. As illustrated, the received baseband signals 301 are processed by the frequency adjustment module 302 (over processing time $T_{Freq}$) to adjust the signal frequency. The resulting signal is processed by the window/folding module 304 (over processing time $T_{Wfold}$) to window and fold the appropriate symbol samples, and is then sequentially processed by the fast Fourier transform (FFT) module 306 (over processing time $T_{FFT}$), the phase equalization module 308 (over processing time $T_{Phase}$), and the frame synchronization module 310 (over processing time $T_{FrameSync}$) to transform, equalize and synchronize the signal for input to the channel state indicator module 312 for processing (over processing time $T_{CSI}$) to generate channel state information 315.

The channel state information 315 is processed by the signal quality module 314 along with service mode information 311 (provided by the frame synchronization module 310) and sideband information 313 (provided by the channel state indicator module 312) to calculate signal quality values 316 (e.g., SNR CD/No sample values) over time. In selected embodiments, each Cd/No value is calculated at the signal quality module 314 based on the signal-to-noise ratio (SNR) value of equalized upper and lower primary sidebands 313 provided by the CSI module 312. The SNR may be calculated by summing up $I^2$ and $Q^2$ from each individual upper and lower primary bins. Alternatively, the SNR may be calculated by separately computing SNR values from the upper sideband and lower sideband, respectively, and then selecting the stronger SNR value. In addition, the signal quality module 314 may use primary service mode information 311 extracted from system control data in frame synchronization module 310 to calculate different Cd/No values for different modes. For example, the CD/No sample values may be calculated as Cd/No_FM=10*log 10(SNR/360)/2+C, where the value of "C" depends on the mode. Based on the inputs, the signal quality module 314 generates channel state information output signal values for the symbol tracking module 317 where they are processed (over processing time $T_{Track}$) and then forwarded for deinterleaving at the deinterleaver module 318 (over processing time $T_{Deint}$) to produce soft decision bits. A Viterbi decoder 320 processes the soft decision bits to produce decoded program data units on the Layer 2 output line.

Figure 4:
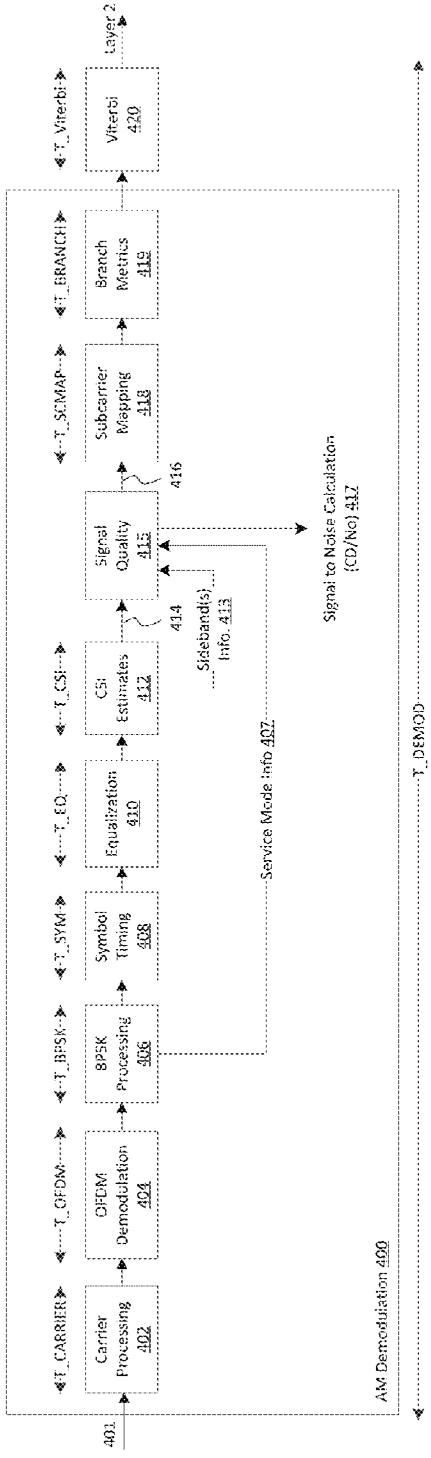
FIG. 4 illustrates a simplified timing block diagram of an exemplary AM demodulation module for calculating predetermined signal quality information for use in removing signal interference artifacts from audio AM signals in accordance with selected embodiments.

An exemplary AM demodulation module 400 is illustrated in FIG. 4 which shows a simplified timing block diagram of the AM demodulation module components for calculating predetermined signal quality information for use in removing signal interference artifacts from audio AM signals in accordance with selected embodiments. As illustrated, the received baseband signals 401 are processed by the carrier processing module 402 (over processing time $T_{Carrier}$) to generate a stream of time domain samples. The resulting signal is processed by the OFDM demodulation module 404 (over processing time $T_{OFDM}$) to produce frequency domain symbol vectors which are processed by the binary phase shift key (BPSK) processing module 406 (over processing time $T_{BPSK}$) to generate BPSK values. At the symbol timing module 408, the BPSK values are processed (over processing time $T_{SYM}$) to derive symbol timing error values. The equalizer module 410 processes the frequency domain symbol vectors in combination with the BPSK and carrier signals (over processing time $T_{EQ}$) to produce equalized signals for input to the channel state indicator estimator module 412 for processing (over processing time $T_{CSI}$) to generate channel state information 414.

The channel state information 414 is processed by the signal quality module 415 along with service mode information 407 (provided by the BPSK Processing module 406) and sideband information 413 (provided by the CSI estimator module 412) to calculate signal quality values 417 (e.g., SNR CD/No sample values) over time. In selected embodiments, each Cd/No value is calculated at the signal quality module 415 based on equalized upper and lower primary sidebands 413 provided by the CSI estimation module 412. The SNR may be calculated by summing up $I^2$ and $Q^2$ from each individual upper and lower primary bins. Alternatively, the SNR may be calculated by separately computing SNR values from the upper sideband and lower sideband, respectively, and then selecting the stronger SNR value. In addition, the signal quality module 415 may use the primary service mode information 407 which is extracted by the BPSK processing module 406 to calculate different Cd/No values for different modes. For example, the CD/No sample values may be calculated as Cd/No_AM=10*log 10((800/SNR)*4306.75)+C, where the value of "C" depends on the mode. The signal quality module 415 also generates CSI output signal values 416 for the subcarrier mapping module 418 where the signals are mapped (over processing time $T_{SCMAP}$) to subcarriers. The subcarrier signals are then processed by the branch metrics module 419 (over processing time $T_{BRANCH}$) to produce branch metrics that are forwarded to the Viterbi decoder 420 which processes the soft decision bits (over processing time $T_{Viterbi}$) to produce decoded program data units on the Layer 2 output line.

As indicated above, the demodulator module 300, 400 calculates predetermined signal quality information (e.g., CD/No) for every mode for storage and retrieval by the artifact reduction module. While any desired signal quality computation may be used, in selected embodiments, the signal quality information may be computed as a signal to noise ratio (CD/No) for use in guiding FM blending decisions using the equation Cd/No_FM=10*log 10(SNR/360)/2+C, where "SNR" is the SNR of equalized upper and lower primary sidebands 313 received from the CSI module 312, and where "C" has a specific value for each FM IBOC mode (e.g., C=51.4 for MP1, C=51.8 for MP2, C=52.2 for MP3, and C=52.9 for MP5, MP6, MP11). Similarly, the signal quality information may be computed as a signal to noise ratio (CD/No) for use in guiding AM blending decisions using the equation Cd/No_AM=10*log 10((800/SNR)*4306.75)+C, where "SNR" is the SNR of equalized upper and lower primary sidebands 413 received from the CSI estimation module 412, and where "C" has a specific value for each AM IBOC mode (e.g., C=30 for MA1 and C=15 for MA3). In other embodiments, the SNR may be calculated separately for the upper sideband and lower sidebands, followed by application of a selection method, such as selecting the stronger SNR value.

Figure 5:
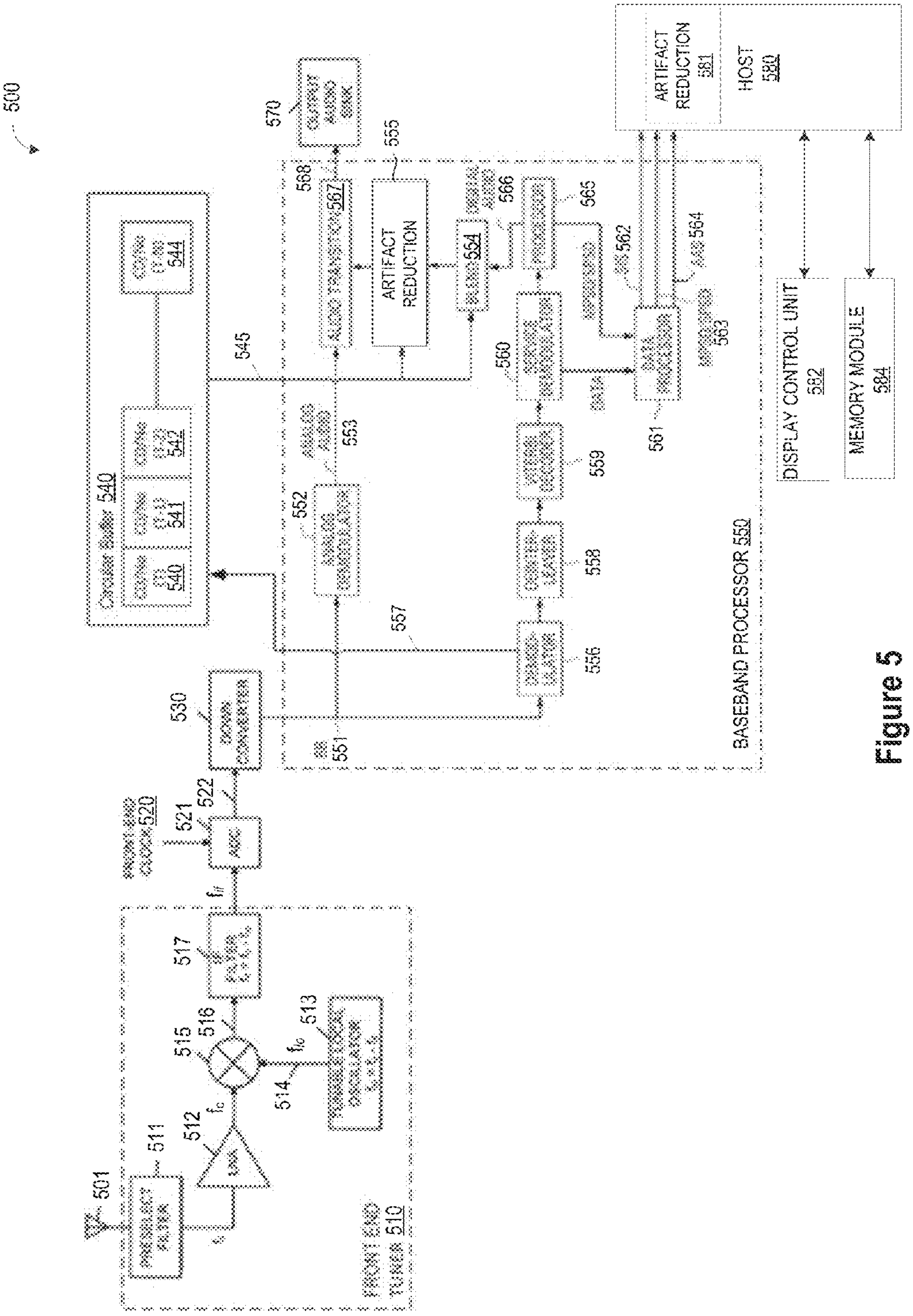
FIG. 5 illustrates a simplified block diagram of an exemplary digital radio broadcast receiver using predetermined signal quality information to reduce signal interference artifacts from the analog and/or digital signals in accordance with selected embodiments.

To further illustrate selected embodiments of the present invention, reference is now made to FIG. 5 which illustrates a simplified block diagram of an exemplary IBOC digital radio broadcast receiver 500 (such as an AM or FM IBOC receiver) which uses predetermined signal quality information to reduce signal interference artifacts from the analog and/or digital signals in accordance with selected embodiments. While only certain components of the receiver 500 are shown for exemplary purposes, it should be apparent that the receiver 500 may include additional or fewer components and may be distributed among a number of separate enclosures having tuners and front-ends, speakers, remote controls, various input/output devices, etc. In addition, many or all of the signal processing functions shown in the digital radio broadcast receiver 500 can be implemented using one or more integrated circuits.

The depicted receiver 500 includes an antenna 501 connected to a front-end tuner 510, where antenna 501 receives composite digital audio broadcast signals. In the front end tuner 510, a bandpass preselect filter 511 passes the frequency band of interest, including the desired signal at frequency $f_c$ while rejecting undesired image signals. Low noise amplifier (LNA) 512 amplifies the filtered signal, and the amplified signal is mixed in mixer 515 with a local oscillator signal $f_{lo}$ supplied on line 514 by a tunable local oscillator 513. This creates sum ($f_c+f_{lo}$) and difference ($f_c-f_{lo}$) signals on line 516. Intermediate frequency filter 517 passes the intermediate frequency signal $f_{if}$ and attenuates frequencies outside of the bandwidth of the modulated signal of interest. An analog-to-digital converter (ADC) 521 operates using the front-end clock 520 to produce digital samples on line 522. Digital down converter 530 frequency shifts, filters and decimates the signal to produce lower sample rate in-phase and quadrature baseband signals on lines 551, and may also output a receiver baseband sampling clock signal (not shown) to the baseband processor 550.

At the baseband processor 550, an analog demodulator 552 demodulates the analog modulated portion of the baseband signal 551 to produce an analog audio signal on line 553 for input to the audio transition module 567. In addition, a digital demodulator 556 demodulates the digitally modulated portion of the baseband signal 551. When implementing an AM demodulation function, the digital demodulator 556 directly processes the digitally modulated portion of the baseband signal 551. However, when implementing an FM demodulation function, the digitally modulated portion of the baseband signal 551 is first filtered by an isolation filter (not shown) and then suppressed by a first adjacent canceller (not shown) before being presented to the OFDM digital demodulator 556. In either the AM or FM demodulator embodiments, the digital demodulator 556 periodically determines and stores a signal quality measure 557 in a circular or ring storage buffer 540 for use in performing artifact reduction processing at the artifact reduction module 555. The signal quality measure may be computed as signal to noise ratio values (CD/No) for each IBOC mode (MP1-MP3, MP5, MP6, MP11, MA1 and MA3) so that a first CD/No value at time (T−N) is stored at 544, and future CD/No values at time (T−2), (T−1) and (T) are subsequently stored at 543, 542, 541 in the circular buffer 540.

After processing at the digital demodulator 556, the digital signal is deinterleaved by a deinterleaver 558, and decoded by a Viterbi decoder 559. A service demodulator 560 separates main and supplemental program signals from data signals. A processor 565 processes the program signals to produce a digital audio signal on line 566. At the blend module 554, the digital audio signal 566 and one or more previously-computed signal quality measure CD/No value(s) 541-544 retrieved 545 from the circular buffer 540 are processed to generate and control a blend algorithm for blending the analog and main digital audio signals in the audio transition module 567. In other embodiments, a supplemental digital audio signal is passed through the blend module 554 (and artifact reduction module 555 and audio transition module 567) to produce an audio output on line 568.

After processing at the blend module 554, the digital signal is processed by the artifact reduction module 555 to remove or reduce signal interference artifacts by using signal quality information extracted from audio samples in one or more buffered audio frames. For example, if the previously-stored digital signal quality measures 541-544 indicate that a buffered audio frame contains clipped noise artifacts and weaker noise artifacts meeting predetermined minimum threshold and count requirements, the artifact reduction module 555 may selectively apply anti-interference processing to remove the signal interference artifacts. As indicated by the placement of the artifact reduction module 581 at the host controller 580, it will be appreciated that the artifact reduction functionality can also be applied outside of the IBOC domain to process digital and/or analog audio signals.

A data processor 561 processes the data signals from the service demodulator 560 to produce data output signals on data lines 562-564 which may be multiplexed together onto a suitable bus such as an inter-integrated circuit ($I^2C$), serial peripheral interface (SPI), universal asynchronous receiver/transmitter (UART), or universal serial bus (USB). The data signals can include, for example, SIS signal 562, MPS or SPS data signal 563, and one or more AAS signals 564.

The host controller 580 receives and processes the data signals 562-564 (e.g., the SIS, MPSD, SPSD, and AAS signals) with a microcontroller or other processing functionality that is coupled to the display control unit (DCU) 582 and memory module 584. Any suitable microcontroller could be used such as an Atmel® AVR 8-bit reduced instruction set computer (RISC) microcontroller, an advanced RISC machine (ARM®) 32-bit microcontroller or any other suitable microcontroller. Additionally, a portion or all of the functions of the host controller 580 could be performed in a baseband processor (e.g. the processor 565 and/or data processor 561). As described above, the host controller 580 may also include an artifact reduction module 581 for efficiently removing signal interference artifacts from digital and/or analog signals by using signal information extracted from audio samples in one or more buffered audio frames to detect clipped noise artifacts and weaker noise artifacts and to selectively apply anti-interference processing to remove the signal interference artifacts.

The DCU 582 comprises any suitable I/O processor that controls the display, which may be any suitable visual display such as an LCD or LED display. In certain embodiments, the DCU 582 may also control user input components via touch-screen display. In certain embodiments the host controller 580 may also control user input from a keyboard, dials, knobs or other suitable inputs. The memory module 584 may include any suitable data storage medium such as RAM, Flash ROM (e.g., an SD memory card), and/or a hard disk drive. In certain embodiments, the memory module 584 may be included in an external component that communicates with the host controller 580, such as a remote control.

Figure 6:
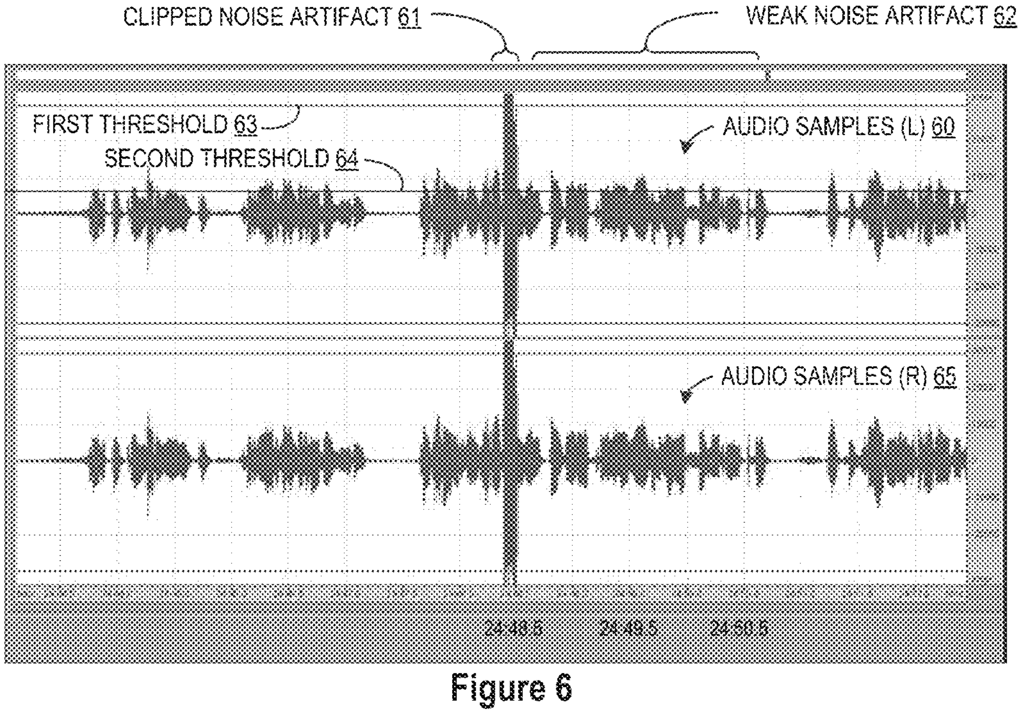
FIG. 6 illustrates a screen capture of samples from a digital audio output which includes a clipped noise and associated weak noise artifacts.
Figure 7:
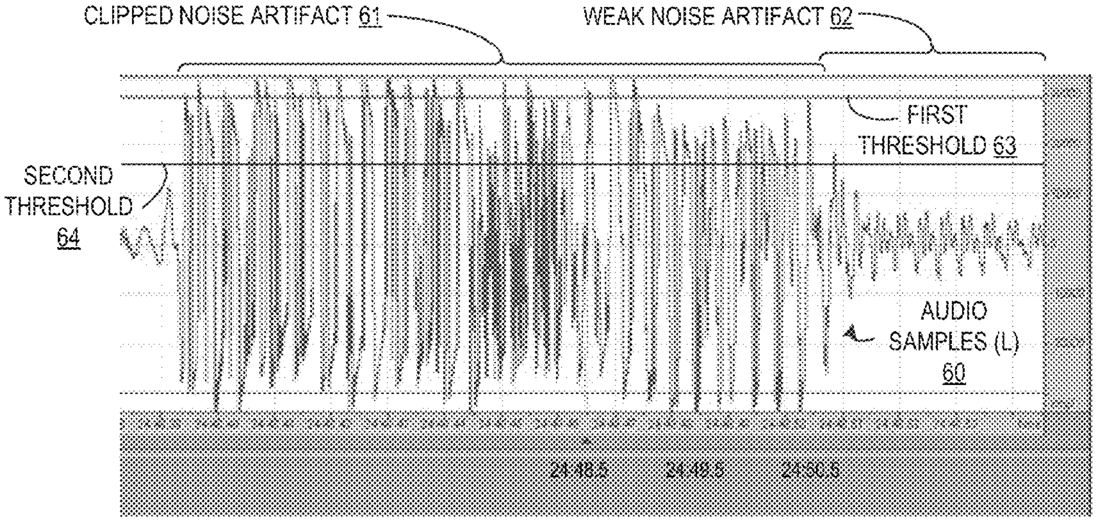
FIG. 7 illustrates an enlargement of the clipped noise and associated weak noise artifacts shown in FIG. 6.

To further illustrate selected embodiments, reference is now made to FIG. 6 which illustrates a screen capture of audio samples from left and right digital audio signals 60, 65. In particular, the left digital audio signal 60 includes a clipped noise artifact 61 and an associated weak noise artifact 62. Similar artifacts may appear in the right digital audio signal 65. In addition, FIG. 7 illustrates an enlargement of the clipped noise and associated weak noise artifacts 61, 62 shown in FIG. 6. The digital audio signals 60, 65 may be generated as audio output from a hybrid IBOC signal receiver system which is configured to process an IBOC FM or AM signal with deteriorated signal-to-noise values (Cd/No). In this configuration, the generated digital audio output from an IBOC FM signal may include a frequent short squawking noise as a signal interference artifact which is high-pitched and is extremely unpleasant for the listener.

As shown in FIGS. 6-7, the left digital audio signal 60 includes a first noise artifact 61 having an oscillating waveform that lasts for approximately 100 ms or 0.1 s, which is equivalent to a duration of about two-three audio frames. The first noise artifact 61 is also characterized by including peak values that are clipped at the max amplitude and that exceed a first specified threshold value 63 (e.g., MaxLvl). However, the left digital audio signal 60 may also include other noise artifacts that are not so strong as to be clipped. For example, the digital audio signal 60 also includes a second noise artifact 62 having a weaker oscillating waveform that lasts for approximately 2 seconds following the first noise artifact 61. The second noise artifact 62 is characterized by including weaker peak values that exceed a second specified threshold value 64 (e.g., MaxLvl).

To efficiently remove the signal interference artifacts 61, 62 from the digital audio signal 60, the received digital audio signal may be processed to store signal samples from one or more audio frames in a memory buffer. Using selected signal quality information from the buffered samples, a first fine-detection process may be applied to detect clipped noise artifacts (e.g., 61) by processing each audio frame of samples (e.g., 2048 samples) using a counter value (e.g., Cnt) to count the number of samples whose amplitude is greater than a first preset threshold amplitude threshold (e.g., MaxLvl). As will be appreciated, the first preset threshold amplitude threshold may be set as a percentage of the maximum or clipping value (e.g., MaxLvl=95% of the max value of 32768=31130). By setting the first preset amplitude threshold sufficiently high, normal audio outputs almost never get disrupted by triggering a false detection. At the same time, it is extremely effective in spotting the strong clipped noise artifacts (e.g., 61). With this approach, the artifact reduction module (e.g., 555 or 581) may include program code to increment the counter value if the absolute amplitude value of an audio sample in the processed audio frame exceeds the first preset threshold amplitude threshold. Upon detecting that the counter value exceeds a specified value (e.g., 32) for a count threshold value (e.g., DetectLen), then the artifact reduction module may designate the processed audio frame under detection as a “bad” frame, such as by setting a status bit or flag associated with the audio frame. As will be appreciated, the fine-detection process may be applied simultaneously to both the left and right channels from each audio frame. If either the left or right channel is flagged as bad, then the entire channel is flagged as bad. In addition, there may be situations where some residual portion of a clipped noise artifact is present in an audio frame that is immediately adjacent to the "bad" audio frame, but not detected with the fine-detection process if the residual portion does not meet the threshold requirements. To address such situations, a plurality of audio frames may be buffered in memory and processed with the fine-detection process applying a sliding window to the buffered samples. Another approach for addressing residual artifact portions is to identify a first audio frame as a "bad" frame using the fine-detection process, and then to automatically flag as "bad" frames the two audio frames immediately before and after the first "bad" audio frame. By running the fine-detection process at full time base, every incoming audio frame is processed to detect clipped noise artifacts. Once a clipped noise artifact is detected in an audio frame, anti-interference processing is applied to the frame to remove the noise from the audio signals, as described more fully below.

In addition to applying a fine-detection process to detect and remove clipped noise artifacts 61, 62 in the digital audio signal 60, the received digital audio signal may also be processed by applying a coarse-detection process to a current audio frame to detect a second threshold number of audio samples meeting or exceeding a second amplitude threshold value 64. In selected embodiments, the coarse-detection process may be designed to detect and block the weak noise interference artifacts (e.g., 62). However, because the weak noise interference artifacts (e.g. 62) have signal amplitudes in the range of regular audio levels, the coarse-detection processing may be configured to run only on a part-time basis. For example, the coarse-detection process may only be enabled after a clipped noise artifact is detected by the fine-detection process (e.g., when the fine-detection changes from positive to negative). Once enabled, the coarse-detection process is applied to detect weak noise artifacts (e.g., 62) by processing selected audio samples using a counter value (e.g., Cnt) to count the number of samples whose amplitude is greater than a second preset amplitude threshold 64 (e.g., MaxLvl). As will be appreciated, the second preset amplitude threshold may be set as a more relaxed setting (e.g., 15000) than the first preset threshold amplitude setting. With this approach, the artifact reduction module (e.g., 555 or 581) may include program code to increment the counter value (e.g., Cnt) if the absolute amplitude value of an audio sample in the sample process region exceeds the second preset threshold amplitude threshold. Upon detecting that the counter value exceeds a specified value (e.g., 3) for a count threshold value (e.g., DetectLen), then the artifact reduction module may designate the processed audio frame under detection for anti-interference processing, such as by setting a status bit or flag associated with the audio frame. Thus, the coarse-detection processing is quite similar to the fine-detection processing. However, coarse-detection processing is performed on the current buffered frame, not the next incoming frame, because only the current frame requires anti-interference processing. Another difference is that the two parameters for processing, MaxLvl and DetectLen, are set as 15000 and 3 respectively, for coarse-detection processing, which are more relaxed for weaker signals than 31130 and 32 from the fine-detection processing.

Once clipped or weak noise artifacts are detected, anti-interference processing may be applied to the current audio frame stored in the buffered memory. In selected embodiments, the anti-interference processing may be implemented as a two-step process for applying one or more low-pass filters to the buffered audio frame(s). As a first preprocessing step, any signal peaks greater than a preset level (clearLevel) may be zeroed out, where the preset level may be set to different values for the fine or coarse detection scenarios. The second step is to perform low-pass filtering of the audio frame after completion of preprocessing. In selected embodiments, the lowpass filter may be a multi-tap lowpass FIR filter.

To conserve processing resources or otherwise provide for more efficient reception processing of the digital radio broadcast signal, the artifact reduction apparatus and methodology described herein may include a bypass mode or functionality to suspend or discontinue artifact detection and anti-interference processing under certain specified conditions. For example, if the computed signal-to-noise ratio values (CD/No) exceed a specified performance threshold (e.g. Cd/No is greater than 56 dB in FM or 66 dB in AM), then the subject audio frame may be considered to be "noise-free" so that no artifact reduction processing is required. In this way, if the audio passes both fine and coarse modules without any positive detection results, the data frame will be sent to a bypass module. This bypass module may be implemented as an all-pass filter with a group delay that matches the low-pass filter described in fine and coarse artifact mitigation modules. This guarantees that the alignment between the digital and analog will not be affected with or without the introduction of the artifact-mitigation module.

Figure 8:
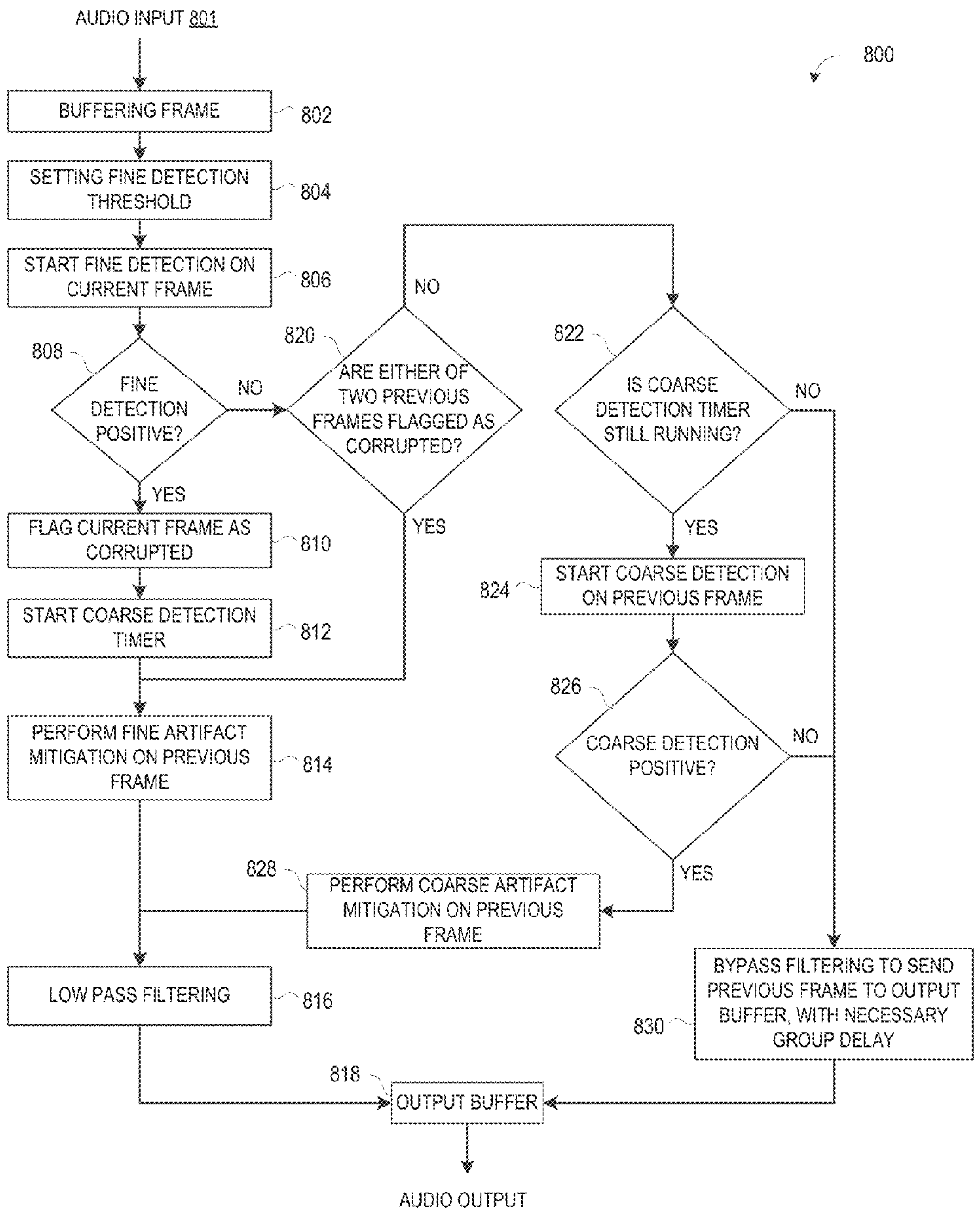
FIG. 8 illustrates an exemplary method for processing interference signal artifacts in a radio broadcast signal.

To further illustrate selected embodiments, reference is now made to FIG. 8 which illustrates an exemplary method 800 for processing interference signal artifacts in a radio broadcast signal. After the method starts at step 801 (e.g., when an audio input signal is received and demodulated at the receiver), a new audio frame is buffered in memory (step 802). From the buffered audio frame, signal quality information is extracted to determine digital signal quality information for use in detecting noise artifacts in the frame. For example, the digital signal quality for the frame may be computed as a signal to noise ratio value (CD/No) for each IBOC mode (e.g., MP1-MP3, MP5, MP6, MP11, MA1 and MA3), and then stored in memory (e.g., a ring buffer). As will be appreciated, additional IBOC modes can be added in the future.

At step 804, one or more fine detection threshold parameters are set or retrieved from memory. For example, a first amplitude threshold (e.g., MaxLvl) may be specified as a percentage (e.g., 95%) of the maximum or clipped value. In addition, a second count threshold (e.g., DetectLen) may be specified as a minimum number of samples in the audio frame that must exceed the first amplitude threshold before the audio frame is flagged as corrupt. If needed, a counter value (Cnt) may also be re-set at this point.

At step 806, a fine detection process for the current frame is started to detect clipped noise artifacts by counting the number of samples in the current frame that exceed the first amplitude threshold. For example, with a buffered audio frame containing 2048 sample points, the counter Cnt may be used to count the number of samples whose amplitude is greater than a preset threshold first amplitude threshold.

At step 808, the signal artifact processing method determines if the fine detection process has detected a clipped noise artifact in the current frame. In selected example embodiments, the current frame is flagged as corrupted at step 810 once it is found that the counter value Cnt exceeds the second count threshold (affirmative outcome to fine detection step 808). In addition, a coarse detection timer is started (at step 812) for purposes of controlling subsequent application of the coarse-detection process described hereinbelow.

After starting the coarse detection timer, the signal artifact processing method performs fine artifact mitigation on the previously buffered frame at step 814. In selected example embodiments, the process for mitigating fine artifacts may include a preprocessing step for zeroing out any signal peaks greater than a first preset level (e.g., ClearLevel) that is set for the fine-detection processing. And at step 816, one or more low pass filters are applied to the subject audio frame after completion of preprocessing. After low pass filtering, the filtered audio frame is transferred to the output buffer at step 818. As will be appreciated, the output buffer and input buffer may be the same memory device.

Referring back to the fine detection step 808, if there is no clipped noise artifact detected in the current frame (negative outcome to step 808), the signal artifact processing method then determines if either of the two previous audio frames have been flagged as corrupted (at step 820). If there is a previous audio frame that is corrupted (affirmative outcome to step 820), then fine artifact mitigation is performed on the corrupted audio frame at step 814. However, if the previous audio frames are not corrupted (negative outcome to step 820), then the signal artifact processing method determines if the coarse detection timer is still running (at step 822). In this way, the coarse detection timer prevents the coarse detection process from being applied to the current frame if the timer has expired (negative outcome to step 822), in which case the low pass filtering step is bypassed so that the previous audio frame may be sent to the output buffer, along with any required group delay (at step 830). However, if the coarse detection timer is still running and has not expired (affirmative outcome to step 822), the signal artifact processing method performs coarse artifact mitigation on the previously buffered frame at step 828, followed by any required low pass filtering at step 816.

Figure 9:
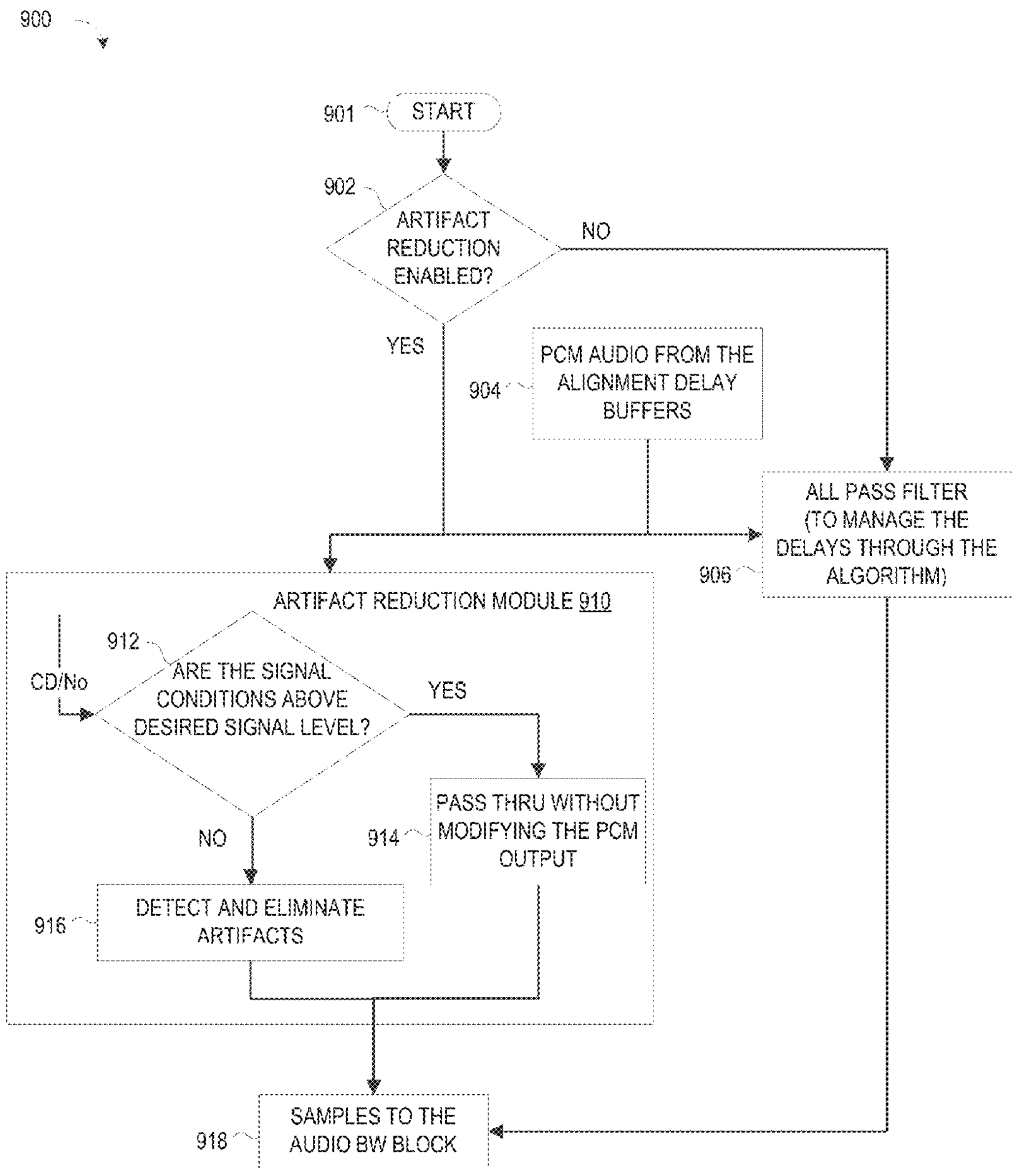
FIG. 9 illustrates an exemplary method for bypassing anti-interference processing in a radio broadcast signal.

To further illustrate selected embodiments, reference is now made to FIG. 9 which illustrates an exemplary method 900 for bypassing anti-interference processing in a radio broadcast signal. After the method starts at step 901 (e.g., when an audio input signal is received and demodulated at the receiver), it is first determined if artifact reduction processing is enabled (step 902). If not (negative outcome from detection step 902), then the audio frame is connected to an all pass filter (at step 906). As shown in FIG. 9, the PCM audio from the alignment delay buffers (904) are provided to the all pass filter which may be configured to provide a group delay that matches the low pass filter that is used to provide fine and coarse artifact mitigation as described hereinbelow. The filtered output samples from step 906 are then passed to the next audio bandwidth block (step 918).

In the event that artifact reduction processing is enabled (affirmative outcome to detection step 902), then the PCM audio from the alignment delay buffers (904) are provided to the artifact reduction module 910. In this module 910, the signal quality measure (e.g., CD/No) is evaluated (at step 912) to detect whether the signal conditions in the audio frame exceed a specified signal quality level. If the signal conditions are good (affirmative outcome to detection step 912), then the PCM audio from the data frame are passed through without modifying the PCM output (e.g., by applying anti-interference processing). However, if the signal conditions are not above the desired signal level (negative outcome to detection step 912), then the PCM audio from the data frame is processed to detect and eliminate or reduce signal interference artifacts (step 916). At step 918, the output from the artifact reduction module 910 is passed to the next audio bandwidth block (step 918).

As will be appreciated, the disclosed method and receiver apparatus for processing a composite digital radio broadcast signal and programmed functionality disclosed herein may be embodied in hardware, processing circuitry, software (including but is not limited to firmware, resident software, microcode, etc.), or in some combination thereof, including a computer program product accessible from a computer-usable or computer-readable medium providing program code, executable instructions, and/or data for use by or in connection with a computer or any instruction execution system, where a computer-usable or computer readable medium can be any apparatus that may include or store the program for use by or in connection with the instruction execution system, apparatus, or device. Examples of a non-transitory computer-readable medium include a semiconductor or solid state memory, magnetic tape, memory card, a removable computer diskette, a random access memory (RAM), a read-only memory (ROM), a rigid magnetic disk and an optical disk, such as a compact disk-read only memory (CD-ROM), compact disk-read/write (CD-R/W) and DVD, or any other suitable memory.

By now it should be appreciated that there is provided herein a receiver for an analog or digital wireless signal (such as an in-band on-channel broadcast signal) and associated method of operation for processing the wireless signal. In selected embodiments, the receiver includes at least one recordable storage medium having stored thereon executable instructions and data which, when executed by at least one processing device, cause the at least one processing device to process signal interference artifacts in a wireless or composite digital radio broadcast signal as described herein. In other embodiments, the receiver is embodied as an article of manufacture having a computer readable storage medium with computer program instructions adapted to cause a processing system to process signal interference artifacts in a wireless or composite digital radio broadcast signal as described herein. As disclosed, a wireless signal (e.g., an over-the-air IBOC digital radio broadcast signal) is received that includes a plurality of audio frames, each comprising a plurality of audio samples. In operation, a first audio frame is stored in a buffer memory, and a plurality of detection threshold parameters are retrieved or set. The detection threshold parameters may include fine detection parameters, such as a first amplitude threshold for comparison to each of the plurality of audio samples in the first audio frame, and a first count threshold for specifying a minimum number of samples in the plurality of audio samples in the first audio frame that must exceed the first amplitude threshold to detect a clipped noise artifact. The detection threshold parameters may also include coarse detection parameters, such as a second amplitude threshold that is smaller than the first amplitude threshold for comparison to each of the plurality of audio samples in the first audio frame, and a second count threshold that is smaller than the first count threshold for specifying a minimum number of samples in the plurality of audio samples in the first audio frame that must exceed the second amplitude threshold to detect an unclipped noise artifact. Using the detection threshold parameters, the plurality of audio samples in the first audio frame are analyzed to detect whether the first audio frame includes a clipped noise artifact. The analysis of the audio samples in the first audio frame may include flagging the first audio frame as corrupt upon detecting that the first audio frame includes at least the first count threshold of audio samples with amplitudes that meet or exceed the first amplitude threshold. If the first audio frame includes the clipped noise artifact, anti-interference processing is applied to the first audio frame to mitigate any detected clipped noise artifact, thereby generating a filtered audio frame. For example, the anti-interference processing applied to the first audio frame may include applying a low pass filter to the first audio frame to mitigate any detected clipped noise artifact. The resulting filtered audio frame is stored in the buffer memory. In addition, a first detection timer may be started upon detecting a clipped noise artifact in the first audio frame. Subsequently, audio samples in a second, subsequent audio frame may be analyzed using the plurality of detection threshold parameters to detect whether the second, subsequent audio frame includes a clipped noise artifact. If the second, subsequent audio frame does not include a clipped noise artifact, the audio samples in the first audio frame may be analyzed using the plurality of detection threshold parameters to detect whether the first audio frame includes an unclipped noise artifact if the first detection timer has not expired. In addition, coarse artifact mitigation processing may be applied to the first audio frame if the first audio frame includes the unclipped noise artifact to mitigate any detected unclipped noise artifact. On the other hand, if the first detection timer has expired, then the analysis of the plurality of audio samples in the first audio frame to detect an unclipped noise artifact may be bypassed.

Although the described exemplary embodiments disclosed herein are directed to an exemplary IBOC system for processing signal interference artifacts in analog and digital signals using digital signal quality metrics, the present invention is not necessarily limited to the example embodiments which illustrate inventive aspects of the present invention that are applicable to a wide variety of digital radio broadcast receiver designs and/or operations. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A processor-implemented method for processing signal interference artifacts in a composite digital radio broadcast signal, comprising:
- receiving a composite digital radio broadcast signal comprising a plurality of audio frames, each comprising a plurality of audio samples;
- storing a first audio frame in a buffer memory;
- retrieving a plurality of detection threshold parameters;
- analyzing a plurality of audio samples in the first audio frame using the plurality of detection threshold parameters to detect whether the first audio frame includes a clipped noise artifact;
- applying anti-interference processing to the first audio frame if the first audio frame includes the clipped noise artifact to mitigate any detected clipped noise artifact, thereby generating a filtered audio frame; and
- storing the filtered audio frame in the buffer memory.

2. The processor-implemented method of claim 1, where receiving the composite digital radio broadcast signal comprises receiving an over-the-air in-band on-channel digital radio broadcast signal.

3. The processor-implemented method of claim 1, where retrieving the plurality of detection threshold parameters comprises retrieving fine detection parameters comprising:
- a first amplitude threshold for comparison to each of the plurality of audio samples in the first audio frame; and
- a first count threshold for specifying a minimum number of samples in the plurality of audio samples in the first audio frame that must exceed the first amplitude threshold to detect a clipped noise artifact.

4. The processor-implemented method of claim 3, where analyzing the plurality of audio samples in the first audio frame comprises flagging the first audio frame as corrupt upon detecting that the first audio frame includes at least the first count threshold of audio samples with amplitudes that meet or exceed the first amplitude threshold.

5. The processor-implemented method of claim 4, where applying anti-interference processing to the first audio frame comprises applying a low pass filter to the first audio frame to mitigate any detected clipped noise artifact.

6. The processor-implemented method of claim 1, further comprising:
- starting a first detection timer upon detecting a clipped noise artifact in the first audio frame;
- analyzing a plurality of audio samples in a second, subsequent audio frame using the plurality of detection threshold parameters to detect whether the second, subsequent audio frame includes a clipped noise artifact;
- analyzing the plurality of audio samples in the first audio frame using the plurality of detection threshold parameters to detect whether the first audio frame includes an unclipped noise artifact if the second, subsequent audio frame does not include a clipped noise artifact and if the first detection timer has not expired; and
- applying coarse artifact mitigation processing to the first audio frame if the first audio frame includes the unclipped noise artifact to mitigate any detected unclipped noise artifact.

7. The processor-implemented method of claim 6, where retrieving the plurality of detection threshold parameters comprises retrieving coarse detection parameters comprising:
- a second amplitude threshold that is smaller than the first amplitude threshold for comparison to each of the plurality of audio samples in the first audio frame; and
- a second count threshold that is smaller than the first count threshold for specifying a minimum number of samples in the plurality of audio samples in the first audio frame that must exceed the second amplitude threshold to detect an unclipped noise artifact.

8. The processor-implemented method of claim 1, further comprising:
- starting a first detection timer upon detecting a clipped noise artifact in the first audio frame;
- analyzing a plurality of audio samples in a second, subsequent audio frame using the plurality of detection threshold parameters to detect whether the second, subsequent audio frame includes a clipped noise artifact; and
- bypassing analysis of the plurality of audio samples in the first audio frame to detect an unclipped noise artifact if the second, subsequent audio frame does not include a clipped noise artifact and if the first detection timer has expired.

9. A digital radio broadcast receiver comprising at least one non-transitory recordable storage medium having stored thereon executable instructions and data which, when executed by at least one processing device, cause the at least one processing device to process signal interference artifacts in a composite digital radio broadcast signal by:

receiving a composite digital radio broadcast signal comprising a plurality of audio frames, each comprising a plurality of audio samples;

storing a first audio frame in a buffer memory;

retrieving a plurality of detection threshold parameters;

analyzing a plurality of audio samples in the first audio frame using the plurality of detection threshold parameters to detect whether the first audio frame includes a clipped noise artifact;

applying anti-interference processing to the first audio frame if the first audio frame includes the clipped noise artifact to mitigate any detected clipped noise artifact, thereby generating a filtered audio frame; and storing the filtered audio frame in the buffer memory.

10. The digital radio broadcast receiver of claim 9, wherein the executable instructions and data, when executed by at least one processing device, cause the at least one processing device to receive the composite digital radio broadcast signal by receiving an over-the-air in-band on-channel digital radio broadcast signal.

11. The receiver of claim 9, wherein the executable instructions and data, when executed by at least one processing device, cause the at least one processing device to retrieve the plurality of detection threshold parameters by retrieving fine detection parameters comprising:

a first amplitude threshold for comparison to each of the plurality of audio samples in the first audio frame; and a first count threshold for specifying a minimum number of samples in the plurality of audio samples in the first audio frame that must exceed the first amplitude threshold to detect a clipped noise artifact.

12. The receiver of claim 11, wherein the executable instructions and data, when executed by at least one processing device, cause the at least one processing device to analyze the plurality of audio samples in the first audio frame by flagging the first audio frame as corrupt upon detecting that the first audio frame includes at least the first count threshold of audio samples with amplitudes that meet or exceed the first amplitude threshold.

13. The receiver of claim 12, wherein the executable instructions and data, when executed by at least one processing device, cause the at least one processing device to apply anti-interference processing to the first audio frame by applying a low pass filter to the first audio frame to mitigate any detected clipped noise artifact.

14. The receiver of claim 9, further comprising executable instructions and data which cause the at least one processing device to process signal interference artifacts by:

starting a first detection timer upon detecting a clipped noise artifact in the first audio frame;

analyzing a plurality of audio samples in a second, subsequent audio frame using the plurality of detection threshold parameters to detect whether the second, subsequent audio frame includes a clipped noise artifact;

analyzing the plurality of audio samples in the first audio frame using the plurality of detection threshold parameters to detect whether the first audio frame includes an unclipped noise artifact if the second, subsequent audio frame does not include a clipped noise artifact and if the first detection timer has not expired; and applying coarse artifact mitigation processing to the first audio frame if the first audio frame includes the unclipped noise artifact to mitigate any detected unclipped noise artifact.

15. The receiver of claim 14, wherein the executable instructions and data, when executed by at least one processing device, cause the at least one processing device to retrieve the plurality of detection threshold parameters by retrieving coarse detection parameters comprising:

a second amplitude threshold that is smaller than the first amplitude threshold for comparison to each of the plurality of audio samples in the first audio frame; and a second count threshold that is smaller than the first count threshold for specifying a minimum number of samples in the plurality of audio samples in the first audio frame that must exceed the second amplitude threshold to detect an unclipped noise artifact.

16. The receiver of claim 9, further comprising executable instructions and data which cause the at least one processing device to process signal interference artifacts by:

starting a first detection timer upon detecting a clipped noise artifact in the first audio frame;

analyzing a plurality of audio samples in a second, subsequent audio frame using the plurality of detection threshold parameters to detect whether the second, subsequent audio frame includes a clipped noise artifact; and bypassing analysis of the plurality of audio samples in the first audio frame to detect an unclipped noise artifact if the second, subsequent audio frame does not include a clipped noise artifact and if the first detection timer has expired.

17. An article of manufacture comprising a non-transitory computer readable storage medium having computer program instructions adapted to cause a processing system to:

control reception of a wireless signal comprising a plurality of audio frames, each comprising a plurality of audio samples;

store a first audio frame in a buffer memory;

retrieve a plurality of detection threshold parameters;

analyze a plurality of audio samples in the first audio frame using the plurality of detection threshold parameters to detect whether the first audio frame includes a clipped noise artifact;

apply anti-interference processing to the first audio frame if the first audio frame includes the clipped noise artifact to mitigate any detected clipped noise artifact, thereby generating a filtered audio frame; and store the filtered audio frame in the buffer memory.

18. The article of manufacture of claim 17, where the wireless signal is received as an over-the-air in-band on-channel digital radio broadcast signal.

19. The article of manufacture of claim 17, where the plurality of detection threshold parameters comprises:

a first amplitude threshold for comparison to each of the plurality of audio samples in the first audio frame; and a first count threshold for specifying a minimum number of samples in the plurality of audio samples in the first audio frame that must exceed the first amplitude threshold to detect a clipped noise artifact.

20. The article of manufacture of claim 19, where the plurality of audio samples in the first audio frame are analyzed by flagging the first audio frame as corrupt upon detecting that the first audio frame includes at least the first count threshold of audio samples with amplitudes that meet or exceed the first amplitude threshold.

* * * * *